(12) United States Patent
Ogawa et al.

(10) Patent No.: US 6,420,283 B1
(45) Date of Patent: Jul. 16, 2002

(54) METHODS FOR PRODUCING COMPOUND SEMICONDUCTOR SUBSTRATES AND LIGHT EMITTING ELEMENTS

(75) Inventors: Atsushi Ogawa, Tenri; Takayuki Yuasa, Nara-ken, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/179,250

(22) Filed: Oct. 26, 1998

(30) Foreign Application Priority Data

Oct. 28, 1997 (JP) ............................................. 9-295140

(51) Int. Cl.⁷ ............................................. H01L 21/26
(52) U.S. Cl. ...................... 438/796; 438/572; 438/573; 438/590; 438/602; 438/604; 438/606; 438/779
(58) Field of Search .................................. 438/479, 488, 438/489, 604, 606, 758, 930, 967, 796, 572, 573, 590, 602, 603, 605, 779; 117/84, 90, 93, 102

(56) References Cited

U.S. PATENT DOCUMENTS

| 4,874,438 A | * | 10/1989 | Oshita et al. ................ 148/400 |
| 6,017,774 A | * | 1/2000 | Yuasa et al. ................... 438/46 |
| 6,086,673 A | * | 7/2000 | Molnar .......................... 117/90 |

FOREIGN PATENT DOCUMENTS

| JP | 08203834 A | 8/1986 |
| JP | 02229476 A | 9/1990 |
| JP | 04297023 A | 10/1992 |
| JP | 07277884 A | 10/1995 |

\* cited by examiner

Primary Examiner—Carl Whitehead, Jr.
Assistant Examiner—Khanh Duong
(74) Attorney, Agent, or Firm—Morrison & Foerster LLP

(57) ABSTRACT

Methods are provided for producing a compound semiconductor substrate including: a mica substrate; and a III-V group compound semiconductor layer containing nitrogen as its main component grown on the mica substrate.

27 Claims, 4 Drawing Sheets

METHODS FOR PRODUCING COMPOUND SEMICONDUCTOR SUBSTRATES AND LIGHT EMITTING ELEMENTS

BACKGROUND OF THE INVENTION

1. Field of the Invention

The present invention relates to a III-V group compound semiconductor substrate containing nitrogen as its main component, and a method for producing the same. More specifically, the present invention relates to a III-V group compound semiconductor substrate containing nitrogen as its main component, preferably used as a substrate of a light-emitting element, and a method for producing the same.

2. Description of the Related Art

In recent years, blue light-emitting diodes with high brightness have been commercialized, utilizing a GaN compound semiconductor as a material for a light-emitting layer. Therefore, there has been growing interest in a nitride semiconductor as a material for a light-emitting device. Conventionally, a nitride semiconductor is grown by using a hydride vapor phase epitaxy method (hereinafter, referred to as an "HVPE method"), metal organic chemical vapor deposition (hereinafter, referred to as an "MOCVD method"), and a molecular beam epitaxy method (hereinafter, referred to as an "MBE method"). It is preferable that a substrate on which crystal is grown is made of substantially the same material as that for a film to be grown on the substrate. More specifically, it is preferable that a nitride semiconductor is grown on a nitride single crystal substrate. However, it is difficult to obtain a nitride single crystal substrate with a large scale, so that a sapphire substrate (Japanese Laid-open Publication Nos. 2-229476 and 4-297023), an SiC substrate (Japanese Laid-open Publication No. 8-203834), a spinel substrate, a GaAs substrate, and the like have been used in the past.

As described above, in the case where a sapphire substrate is used as a substrate on which a nitride semiconductor is grown, there is an advantage that a sapphire substrate with high purity is easily available. However, there are disadvantages that a sapphire substrate and a nitride semiconductor grown on the substrate have lattice mismatching, and the difference in thermal expansion coefficient therebetween is large. Due to these disadvantages, a lot of defects of about $10^{10}$ $cm^{-2}$ are caused in a growth layer of a nitride semiconductor, and furthermore, potential stress is generated in the growth layer.

In the case where an SiC substrate is used as a substrate on which a nitride semiconductor is grown, the increase in defects caused by the lattice mismatching can be relaxed. However, the problem of potential stress caused by the difference in thermal expansion coefficient remains unsolved, which results in cracks on the surface of a growth film.

Furthermore, in the case where a GaAs substrate is used as a substrate on which a nitride semiconductor is grown, a crystal growth temperature is limited to a temperature for generating a GaAs layer. Thus, a crystal growth temperature in the vicinity of 1000° C. required for growing a nitride semiconductor layer cannot be used. If semiconductor crystal is grown at such a low temperature, a growth film is likely to assume a configuration including cubic crystal and hexagonal crystal. This makes it difficult to grow good quality crystal.

SUMMARY OF THE INVENTION

A compound semiconductor substrate of the present invention, includes: a mica substrate; and a III-V group compound semiconductor layer containing nitrogen as its main component grown on the mica substrate.

In one embodiment of the present invention, the above-mentioned compound semiconductor substrate further includes an intermediate layer between the mica substrate and the III-V group compound semiconductor layer.

In another embodiment of the present invention, the above-mentioned compound semiconductor substrate further includes a mask pattern layer on a side of the mica substrate on which the III-V group compound semiconductor layer is grown.

In another embodiment of the present invention, the mica substrate is made of crystal having a composition of $\alpha_{1-x}\beta_{3-y}(\gamma_4O_{10})\delta_2$, wherein $0 \leq x \leq 0.5$;

$0 \leq y \leq 1$;

α is selected from the group consisting of K, Ca, Na, Ba, $NH_4$, and $H_3O$;

β is selected from the group consisting of Al, Fe, Mg, Mn, Li, Zn, V, Cr, and Ti;

γ is one or more element selected from the group consisting of Si, Al, Be, and Fe; and δ is F or OH.

In another embodiment of the present invention, the mica substrate is made of crystal having a composition of $KMg_3(Si_3AlO_{10})F_2$.

In another embodiment of the present invention, the mica substrate is made of crystal having a composition of $KMg_3(Si_3AlO_{10})(OH)_2$.

A method for producing a compound semiconductor substrate of the present invention, includes the step of growing a III-V group compound semiconductor layer containing nitrogen as its main component on a mica substrate.

In one embodiment of the present invention, the above-mentioned method for producing a compound semiconductor substrate further includes the step of providing an intermediate layer between the mica substrate and the III-V group compound semiconductor layer.

In another embodiment of the present invention, the above-mentioned method for producing a compound semiconductor substrate further includes the step of providing a mask pattern layer on a side of the mica substrate on which the III-V group compound semiconductor layer is grown.

In another embodiment of the present invention, the above-mentioned method for producing a compound semiconductor substrate further includes the step of peeling the mica substrate from the III-V group compound semiconductor layer.

In another embodiment of the present invention, the mica substrate is made of crystal having a composition of a $\alpha_{1-x}\beta_{3-y}(\gamma_4O_{10})\delta_2$, wherein $0 \leq x \leq 0.5$;

$0 \leq y \leq 1$;

α is selected from the group consisting of K, Ca, Na, Ba, $NH_4$, and $H_3O$;

β is selected from the group consisting of Al, Fe, Mg, Mn, Li, Zn, V, Cr, and Ti;

γ is one or more element selected from the group consisting of Si, Al, Be, and Fe; and δ is F or OH.

In another embodiment of the present invention, the mica substrate is made of crystal having a composition of $KMg_3(Si_3AlO_{10})F_2$.

In another embodiment of the present invention, the mica substrate is made of crystal having a composition of $KMg_3(Si_3AlO_{10})(OH)_2$.

In another embodiment of the present invention, the step of growing the III-V group compound semiconductor layer on the mica substrate includes the steps of: forming a mask pattern layer on the mica substrate; forming an intermediate layer in a region of the mica substrate where the mask pattern layer is not formed; growing a first III-V group compound semiconductor layer containing nitrogen as its main component on the intermediate layer by a first growth method; and growing a second III-V group compound semiconductor layer having the same composition as the composition of the first III-V group compound semiconductor layer on the first III-V group compound semiconductor layer by a second growth method, and the method further includes the step of peeling the mica substrate from the first and second III-V group compound semiconductor layers.

A light-emitting element of the present invention includes a semiconductor layered structure including at least a light-emitting layer on the above-mentioned III-V group compound semiconductor layer.

A method for producing a light-emitting element of the present invention includes the step of providing a semiconductor layered structure including at least a light-emitting layer on a III-V group compound semiconductor layer, wherein the III-V group compound semiconductor layer is produced during the above-mentioned step of growing the III-V group compound semiconductor layer.

According to the present invention, a compound semiconductor substrate including a III-V group compound crystal layer with high crystallinity containing nitrogen as its main component can be obtained by applying a mica substrate to a substrate for growing a III-V group compound semiconductor containing nitrogen as its main component.

In the mica substrate, generally, a ratio between binding force in a c-axis direction and binding force in a direction of a plane formed by an a-axis and a b-axis (hereinafter, referred to as an "in-plane direction") is 1:about 10 to about 100, and defects are likely to be introduced in a layer in-plane direction. Furthermore, a ratio between binding force in a layer in-plane direction of a mica substrate and binding force of a III-V group compound semiconductor layer containing nitrogen as its main component is 1:about 10 to about 100. Therefore, even when stress (which is caused by the lattice mismatching between the mica substrate and the III-V group compound semiconductor layer containing nitrogen as its main component) is applied to the III-V group compound semiconductor layer containing nitrogen as its main component grown on the mica substrate, defects such as dislocations are introduced in a layer in-plane direction of the mica substrate to relax the stress. Because of this, a III-V group compound semiconductor layer with satisfactory crystallinity containing nitrogen as its main component can be obtained, in which the defects in a c-axis direction of the III-V group compound semiconductor layer containing nitrogen as its main component are suppressed, and dislocation density (defects) of GaN, AlN, $Al_xGa_{1-x}N(0<x<1)$, $In_yGa_{1-y}N(0<y<1)$ is small.

Furthermore, after a III-V group compound semiconductor layer containing nitrogen as its main component is grown on a mica substrate, the mica substrate can be easily removed from the semiconductor layer by peeling. Therefore, it is not required that a notch is previously provided in the mica substrate for the purpose of easily detaching the mica substrate. Moreover, a material for the mica substrate can be selected so as to have appropriate heat resistance, lattice constant, and/or thermal expansion coefficient, depending upon the purpose. Therefore, a III-V group compound semiconductor substrate containing nitrogen as its main component can be provided, which is suitable for producing a light-emitting element with suitable light-emitting characteristics.

Thus, the invention described herein makes possible the advantage of providing a substrate with high heat resistance in which the difference in a lattice constant and in a thermal expansion coefficient is relatively small between the substrate and the III-V group compound semiconductor containing nitrogen as its main component to be grown on the substrate and which allows a III-V group compound semiconductor layer containing nitrogen as its main component to be grown on the substrate at high temperatures, thereby obtaining good quality crystal of a III-V group compound semiconductor containing nitrogen as its main component.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of illustrative embodiments with reference to the drawings. Throughout the specification, the term "III-V group compound semiconductor containing nitrogen as its main component" refers to a III-V group compound semiconductor in which a V group element is nitrogen. Examples of the III-V group compound semiconductor include GaN, AlN, $Al_xGa_{1-x}N(0<x<1)$, InN, $In_yGa_{1-y}N(0<y<1)$, and $In_\alpha Ga_\beta Al_{1-\alpha-\beta}N$ $(0<\alpha<1, 0<\beta<1)$.

Embodiment 1

Figure 1:
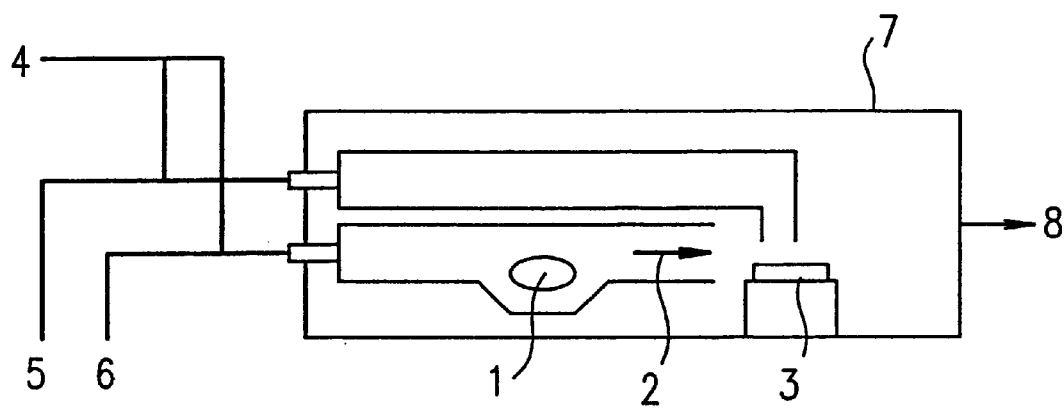
FIG. 1 is a schematic view of an HVPE apparatus, illustrating a method for producing a compound semiconductor substrate including a GaN crystal layer in Embodiment 1 of the present invention.
Figure 2:
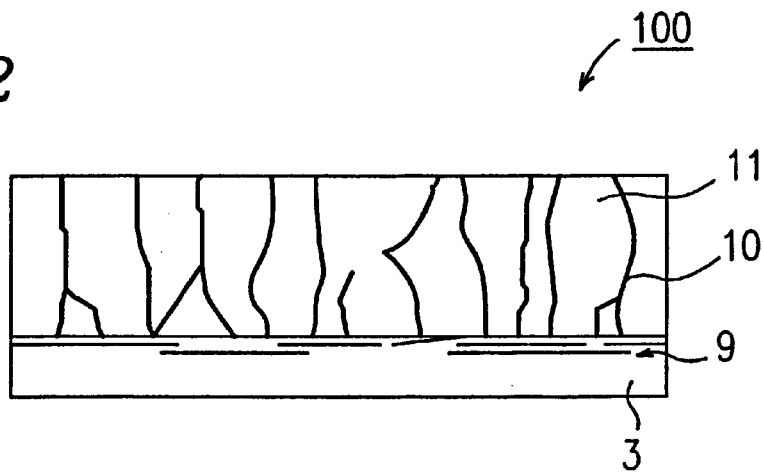
FIG. 2 is a cross-sectional view of a compound semiconductor substrate including a GaN crystal layer grown on mica, produced by an HVPE method in Embodiment 1 of the present invention.

In the present embodiment, the case where a GaN crystal layer is grown by using an HVPE method will be described with reference to FIGS. 1 and 2. FIG. 1 shows a schematic view of an apparatus for growing crystal using an HVPE method utilized in the present embodiment. FIG. 2 shows a cross-sectional view of a compound semiconductor substrate 100 produced in the present embodiment. A substrate for growth 3 is a mica substrate made of synthetic mica (KMg$_3$(Si$_3$AlO$_{10}$)F$_2$), and a substrate surface is prescribed as a C-plane of the mica substrate. Synthetic mica (KMg$_3$(Si$_3$AlO$_{10}$)F$_2$) has a relatively high melting temperature of about 1350° C. among mica. Thus, synthetic mica is stable even at a growth temperature (about 1000° C.) of a GaN layer, which is a relatively high growth temperature among those of the III-V group compound semiconductor layer containing nitrogen as its main component.

First, the surface of the mica substrate 3 was washed with an organic solvent, and cleaned in a flow of H$_2$ at about 1000° C. Then, the mica substrate 3 was placed in a growth chamber in the crystal growth apparatus. A III group material and a V group material were mixed over the mica substrate 3 and supplied onto the mica substrate 3 while the mica substrate 3 was maintained at about 1000° C. Thus, a GaN crystal layer (growth film) 11 (i.e., a III-V group compound semiconductor layer) was grown on the mica substrate 3 for about 3 hours.

During the crystal growth, a mixture of a gallium chloride 2 formed by introducing an HCl gas 6 (about 100 cc/min.) onto Ga metal 1 maintained at about 700° C. and an H$_2$ gas (carrier gas) 4 (about 1000 cc/min.) was supplied as the III group material. Furthermore, a mixture of an ammonia gas (NH$_3$) 5 (about 2000 cc/min.) and an H$_2$ gas (carrier gas) 4 (about 10000 cc/min.) was supplied as the V group material. In the crystal growth apparatus, these material gases and carrier gas were sent to a discharge apparatus 8 through a quartz reaction tube 7. After crystal growth, a compound semiconductor substrate 100 thus produced was naturally cooled, and taken out of the growth chamber.

The thickness of the growth film 11 was about 300 μm. The growth film 11 was transparent, and exhibited about 15 arcmin. of half-width of a diffraction peak obtained with respect to crystal (0004) irradiated with X-rays. Although the surface of the growth film 11 had unevenness of about 1 μm, there were a few dislocations 10 (about $10^8$ cm$^{-2}$) generated on the surface of the growth film 11. Defect density was reduced for the following reasons: cracks 9 were generated in an in-plane direction on the mica substrate 3 during growth of the growth film 11 and during natural cooling of the produced compound semiconductor substrate 100, which relaxed strain stress caused by the difference in lattice mis-matching and thermal expansion coefficient between the mica substrate 3 and the growth film 11. More specifically, the direction relationship of the growth film 11 is GaN[11-20]//mica[10-10], GaN[10-10]//mica[11-20], and an a-axis direction of GaN matches a b-axis direction of mica in the surface of the growth film 11. The lattice mismatching in this case is 4.13% (=((b-axis lattice constant of GaN)–(a-axis lattice constant of mica))/(a-axis lattice constant of mica)×100) in the a-axis direction of mica, and 4.03% (=((triple period of an a-axis lattice constant of GaN)–(b-axis lattice constant of mica))/(b-axis lattice constant of mica)×100). The ratio in a thermal expansion coefficient between the mica substrate and the growth film is about 3 to about 5 (=(thermal expansion coefficient in an in-plane direction of GaN)/(thermal expansion coefficient in an in-plane direction of mica)).

In the present embodiment, when In$_y$Ga$_{1-y}$N(0<y<1) was used for the growth film, in place of GaN, the same effects as those described above were obtained. Furthermore, even when a crystal layer of AlN, Al$_x$Ga$_{1-x}$N(0<x<1), In$_y$Ga$_{1-y}$N (0<y<1), or In$_\alpha$Ga$_\beta$Al$_{1-\alpha-\beta}$N(0<α<1, 0<β<1) was grown by using a growth method such as an MOCVD method, an MBE method, or an MOMBE method, in place of the HVPE method, the same effects as those described above were obtained. Furthermore, it was confirmed that even when a III-V group compound semiconductor having a multi-layer structure is grown by varying the composition of a crystal growth layer, and the kind, concentration, etc. of a dopant, the same effects as those in the present embodiment are obtained.

Furthermore, the compound semiconductor substrate including a III-V group compound semiconductor layer such as a GaN crystal layer can be used as a substrate on which a III-V group compound semiconductor crystal containing nitrogen as its main component is grown. In the case where the compound semiconductor substrate containing a III-V group compound semiconductor crystal layer of the present embodiment is used as a substrate on which a III-V group compound semiconductor containing nitrogen as its main component is grown, higher quality crystal growth layer can be obtained, compared with the case of using a substrate made of a material different from growth crystal, such as a sapphire substrate, a GaAs substrate, or an SiC substrate.

Embodiment 2

In the present embodiment, the case where a ZnO film produced by sputtering is provided as an intermediate layer between a substrate and a growth film will be described. In the same way as in Embodiment 1, a mica substrate made of synthetic mica (KMg$_3$(Si$_3$AlO$_{10}$)F$_2$) is used as a substrate for growth, and the surf ace of the substrate is prescribed as a C-plane of the mica substrate.

First, the surface of the mica substrate was washed with an organic solvent. The mica substrate was placed in a sputtering apparatus. The vacuum degree in the sputtering apparatus was set at about $10^{-8}$ Torr, and then, the mica substrate was cleaned by being heated at about 1000° C. A mixed gas of argon and oxygen was introduced into the sputtering apparatus, and the supply amount and discharge amount of the gas was regulated so that the pressure in the sputtering apparatus became $10^{-2}$ Torr. Thereafter, while target ZnO ceramic was cooled with water, Zn ceramic was sputtered onto the mica substrate at a high frequency of 13.56 MHz. The temperature of the mica substrate was set at about 20° C., and the input power was set at 300 W. The thickness of the ZnO film grown for about 30 minutes was about 100 nm. Using the ZnO film thus produced as an intermediate layer, a GaN film was grown on the intermediate layer by the HVPE method in the same way as in Example 1.

The GaN film grown on the intermediate layer was transparent, and the unevenness on the surface thereof was about 0.1 μm. The defects generated on the surface of the GaN film grown on the intermediate layer was about $10^7$ cm$^{-2}$. The GaN film exhibited about 5 arcmin. of half-width of a diffraction peak obtained with respect to crystal (0004) irradiated with X-rays. In the present embodiment, in the same way as in Embodiment 1, cracks were generated in an in-plane direction on the mica substrate, which relaxed strain stress caused by the difference in lattice mismatching and thermal expansion coefficient between the mica substrate and the GaN film.

In the present embodiment, even when In$_y$Ga$_{1-y}$N(0<y<1) was used as the growth film, in place of GaN, the same effects as those described above were obtained. Furthermore, even when a crystal layer of AlN, Al$_x$Ga$_{1-x}$N (0<x<1), or In$_y$Ga$_{1-y}$N(0<y<1) was grown by using a growth method such as an MOCVD method, an MBE method, or an MOMBE method, in place of the HVPE method, the same effects as those described above were obtained. Furthermore, it was confirmed that even when a III-V group compound semiconductor having a multi-layer structure is grown by varying the composition of a crystal growth layer, and the kind, concentration, etc. of a dopant, the same effects as those in the present embodiment are obtained.

Furthermore, in the same way as in Embodiment 1, the compound semiconductor substrate including a III-V group compound semiconductor layer such as a GaN crystal layer can be used as a substrate on which a III-V group compound semiconductor crystal containing nitrogen as its main component is grown. In the case where the compound semiconductor substrate containing a III-V group compound semiconductor crystal layer of the present embodiment is used as a substrate on which a III-V group compound semiconductor containing nitrogen as its main component is grown, a higher quality crystal growth layer can be obtained, compared with the case of using a substrate made of a material different from growth crystal, such as a sapphire substrate, a GaAs substrate, or an SiC substrate.

In the present embodiment, a material for the intermediate layer is preferably selected from the group consisting of ZnO, AlN, GaN, and $Al_xGa_{1-x}N(0<x<1)$. An embodiment of the present invention using GaN as a material for the intermediate layer will be described below.

Embodiment 3

In the present embodiment, the case where a GaN film produced by sputtering is provided as an intermediate layer between a substrate and a growth film will be described. In the same way as in Embodiments 1 and 2, the substrate for growth is a mica substrate made of synthetic mica ($KMg_3(Si_3AlO_{10})F_2$), and the surface of the substrate is prescribed as a C-plane of a mica substrate.

First, the surface of the mica substrate was washed with an organic solvent. The mica substrate thus washed was placed in an MOCVD apparatus. The mica substrate was cleaned by being heated at about 800° C. in a flow of hydrogen. Thereafter, the mica substrate was maintained at about 600° C., and trimethylgallium (TMG) as a III group material and $NH_3$ as a V group material were supplied to the apparatus, whereby a GaN film was grown. The supply amount of trimethylgallium was set at about 50 $\mu$mol/min., and the supply amount of $NH_3$ was set at about 4.0 liter/min. The thickness of the GaN film grown for 5 minutes was about 100 nm. As described above, the GaN film produced at a temperature (about 600° C.) lower than a GaN single crystal growth temperature (about 1000° C.) was used as an intermediate layer, and thereafter, a GaN film was grown by the HVPE method in the same way as in Embodiment 1.

The GaN film grown on the intermediate layer was transparent, and the unevenness on the surface thereof was about 0.05 $\mu$m. The defects generated on the surface of the GaN film grown on the intermediate layer was about $10^7$ cm$^{-2}$. Furthermore, the GaN film grown on the intermediate layer exhibited about 4 arcmin. of half-width of a diffraction peak obtained with respect to crystal (0004) irradiated with X-rays. In the present embodiment, in the same way as in Embodiments 1 and 2, cracks were generated in a layer direction on the mica substrate, which relaxed strain stress caused by the difference in lattice mismatching and thermal expansion coefficient between the mica substrate and the GaN film.

In the present embodiment, even in the case of using an AlN intermediate layer similarly grown with trimethylaluminum (TMA), in place of growing the GaN intermediate layer grown with trimethylgallium (TMG) at a low temperature (here, the amount of TMA used was the same as that of TMG), or in the case of using an intermediate layer of $Al_xGa_{1-x}N$ (0<x<1) similarly grown with a mixed gas of trimethylgallium and trimethylaluminum, substantially the same characteristics as those of the GaN film grown on the intermediate layer were obtained.

In the present embodiment, even when $In_yGa_{1-y}N(0<y<1)$ was used as the growth film, in place of GaN, the same effects as those described above were obtained. Furthermore, even when a crystal layer of AlN, $Al_xGa_{1-x}N$ (0<x <1), or $In_yGa_{1-y}N(0<y<1)$ was grown by using a growth method such as an MOCVD method, an MBE method, or an MOMBE method, in place of the HVPE method, the same effects as those described above were obtained. Furthermore, it was confirmed that even when a III-V group compound semiconductor having a multi-layer structure is grown by varying the composition of a crystal growth layer, and the kind, concentration, etc. of a dopant, the same effects as those in the present embodiment are obtained.

Furthermore, in the same way as in Embodiments 1 and 2, the compound semiconductor substrate including a III-V group compound semiconductor crystal layer such as a GaN crystal layer can be used as a substrate on which a III-V group compound semiconductor crystal containing nitrogen as its main component is grown. In the case where the compound semiconductor substrate containing a III-V group compound semiconductor crystal layer of the present embodiment is used as a substrate on which a III-V group compound semiconductor containing nitrogen as its main component is grown, a higher quality crystal growth layer can be obtained, compared with the case of using a substrate made of a material different from growth crystal such as a sapphire substrate, a GaAs substrate, or an SiC substrate, and compared with Embodiments 1 and 2.

Embodiment 4

In the present embodiment, the case where an $In_{0.15}Ga_{0.85}N$ crystal layer is grown on a substrate by using an HVPE method will be described with reference to FIG. 3. A substrate made of mica (Biotite: $KMg_3(Si_3AlO_{10})(OH)_2$, $a_0$=5.314 Å, $b_0$=9.208 Å, $c_0$=10.314 Å) is used as a substrate for growth.

Mica (Biotite: $KMg_3 (Si_3AlO_{10})(OH)_2$) has a decomposition temperature of around 800° C. However, a crystal layer of $In_yGa_{1-y}N(0<y<1)$ is grown at a relatively low temperature (about 770° C). Therefore, mica (Biotite) can be used as a material for a substrate. Furthermore, depending upon the composition of a III-V group compound semiconductor layer containing nitrogen as its main component, mica (Biotite) will have better lattice matching with the semiconductor layer, compared with synthetic mica ($KMg_3(Si_3AlO_{10})F_2$), which results in improvement of crystallinity of a growth material.

An $In_{0.15}Ga_{0.85}N$ crystal layer can be grown at a relatively low temperature (about 770° C.), so that mica (Biotite) whose decomposition temperature is about 800° C. can be used. FIG. 3 is a schematic view of an HVPE apparatus used in the present embodiment.

In the case where a direction relationship of a growth film is $In_{0.15}Ga_{0.85}N[11-20]$//mica[10-10], $In_{0.15}Ga_{0.85}N[10-10]$//mica[11-20], the lattice mismatching is 5.36% (=((triple period of an a-axis lattice constant of $In_{0.15}Ga_{0.85}N$)−(b-axis lattice constant of mica))/(b-axis lattice constant of mica)× 100) in the a-axis direction of mica, and 5.41% (=((b-axis lattice constant of $In_{0.15}Ga_{0.85}N$)−(a-axis lattice constant of mica))/(a-axis lattice constant of mica)×100) in the b-axis direction of mica. On the other hand, in the case of using synthetic mica ($KMg_3 (Si_3AlO_{10})F_2$), the lattice mismatching is 5.69% (=((triple period of an a-axis lattice constant of $In_{0.15}Ga_{0.85}N$)−(b-axis lattice constant of mica))/(b-axis lattice constant of mica)×100) in the a-axis direction of mica, and 5.71% (=((b-axis lattice constant of $In_{0.15}Ga_{0.85}N$)−(a-axis lattice constant of mica))/(a-axis lattice constant of mica)×100) in the b-axis direction of mica. Thus, the lattice mismatching becomes smaller and crystallinity of a growth film is more improved in the case of using mica (Biotite) described in the present embodiment, compared with synthetic mica.

Figure 3:
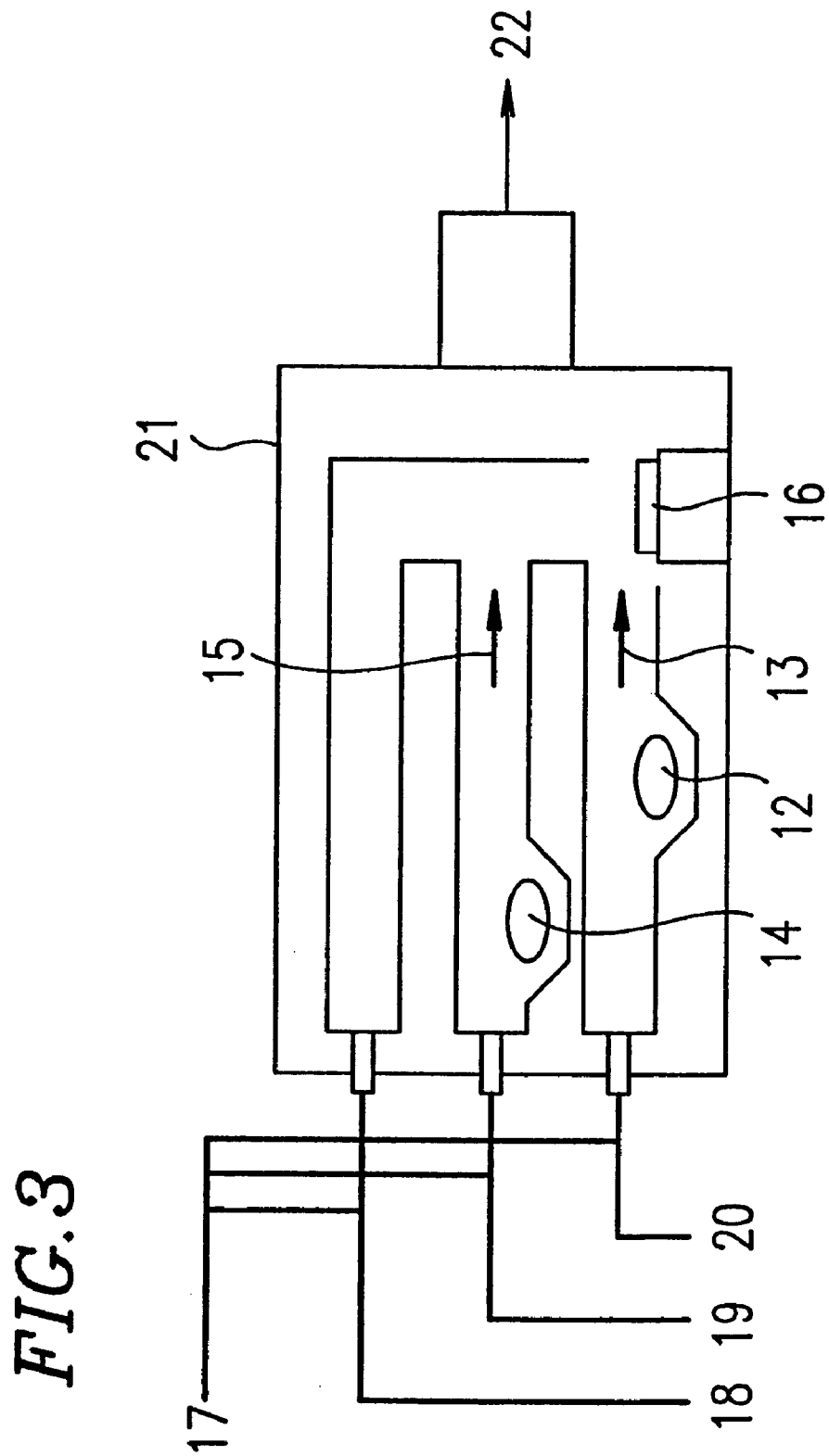
FIG. 3 is a schematic view of an HVPE apparatus, illustrating a method for producing a compound semiconductor substrate including an $In_{0.15}Ga_{0.85}N$ crystal layer in Embodiment 4 of the present invention.

Referring to FIG. 3, the surface of a mica substrate 16 was washed with an organic solvent. The mica substrate 16 was placed in an apparatus, and cleaned in a flow of $H_2$ at about 770° C. A mixture of a III group material and a V group material was supplied onto the mica substrate 16 while the mica substrate 16 was maintained at about 770° C. Thus, an $In_{0.15}Ga_{0.85}N$ crystal layer (growth film, i.e., a III-V group compound semiconductor layer)(not shown) was grown on the mica substrate 16 for about 3 hours.

During the crystal growth, a mixture of a gallium chloride 13 formed by introducing an HCl gas 20 (about 100 cc/min.) onto Ga metal 12 maintained at about 700° C., and an $H_2$ gas 17 (carrier gas) (about 1000 cc/min.) and a mixture of an indium chloride 15 formed by introducing an HCl gas 19 (about 100 cc/min.) onto In metal 14 maintained at about 550° C., and an $H_2$ gas (carrier gas) 17 (about 200 cc/min.) were supplied as the III group material. Furthermore, a mixture of an ammonia gas ($NH_3$) 18 (about 2000 cc/min.) and an $H_2$ gas (carrier gas) 17 (about 10000 cc/min.) was supplied as the V group material. In the apparatus, these material gases and carrier gas were sent to a discharge apparatus 22 through a quartz reaction tube 21. After crystal growth, a compound semiconductor substrate thus produced was naturally cooled, and taken out of a growth chamber.

The thickness of the growth film (not shown) was about 300 μm. The growth film was transparent, and exhibited about 16 arcmin. of half-width of a diffraction peak obtained with respect to crystal (0004) irradiated with X-rays. Although the surface of the growth film had unevenness of about 1 μm, there were a few dislocations (about $10^8$ cm$^{-2}$) generated on the surface of the growth film. Defect density was reduced for the following reasons: cracks (not shown) were generated in a layer direction on the mica substrate 16 during growth of the growth film and during natural cooling of the produced compound semiconductor substrate, which relaxed strain stress caused by the difference in lattice mismatching and thermal expansion coefficient between the mica substrate 16 and the growth film. As predicted in the above, the direction relationship of the growth film is $In_{0.15}Ga_{0.85}N$[11-20]//mica[10-10] and $In_{0.15}Ga_{0.85}N$[10-10]//mica[11-20].

For comparison, in the case where crystal was grown in the same way as the above, using synthetic mica ($KMg_3 (Si_3AlO_{10})F_2$) as a material for a mica substrate, a growth film exhibited about 17 arcmin. of half-width of a diffraction peak obtained with respect to crystal (0004) irradiated with X-rays, and there were dislocations (about $10^9$ cm$^{-2}$) generated on the surface of the growth film. It was found from these data that the use of synthetic mica as a material for a mica substrate decreases crystallinity, compared to the case where mica (Biotite) was used as in the present embodiment. This suggests that a III-V group compound semiconductor with outstanding crystallinity containing nitrogen as its main component can be grown by selecting an appropriate material of mica depending upon the type of growth film.

In the present embodiment, it was confirmed that even when a III-V group compound semiconductor having a multi-layer structure are grown by varying the composition of a crystal growth layer, and the kind, concentration, etc. of a dopant, the same effects as those in the present embodiment are obtained. Regarding the growth method, it was confirmed that more outstanding effects are obtained by an MBE method, an MOMBE method, and the like which allows crystal to grow at a low temperature.

Furthermore, the compound semiconductor substrate including an $In_{0.15}Ga_{0.85}N$ crystal layer produced as described above can be used as a substrate on which a III-V group compound semiconductor containing nitrogen as its main component is grown. In particular, in the case where a crystal layer with a composition of $In_{0.15}Ga_{0.85}N$ is grown on the substrate in the present embodiment, defects can be prevented from occurring in the $In_{0.15}Ga_{0.85}N$ layer, compared with the case of using other substrates. Therefore, when a light-emitting element such as a light-emitting diode and a laser diode provided with an active layer having a composition similar to $In_{0.15}Ga_{0.85}N$ is produced by using the substrate in the present embodiment, a device with more outstanding light-emitting characteristics can be obtained.

Embodiment 5

Figure 4:
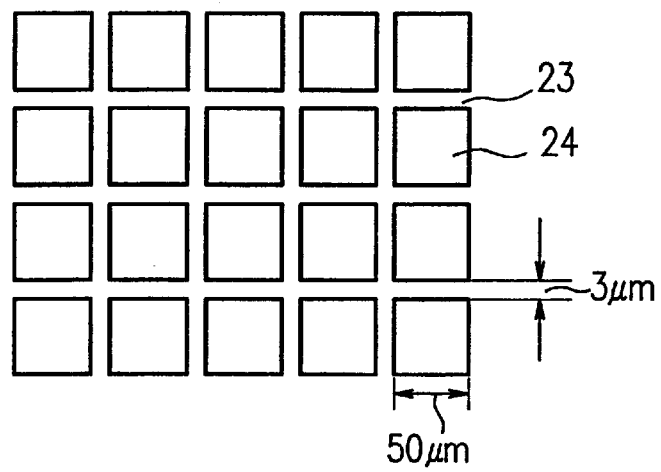
FIG. 4 is a top view of a mica substrate including an $SiO_2$ layer as a mask pattern layer, produced in Embodiment 5 of the present invention.
Figure 5:
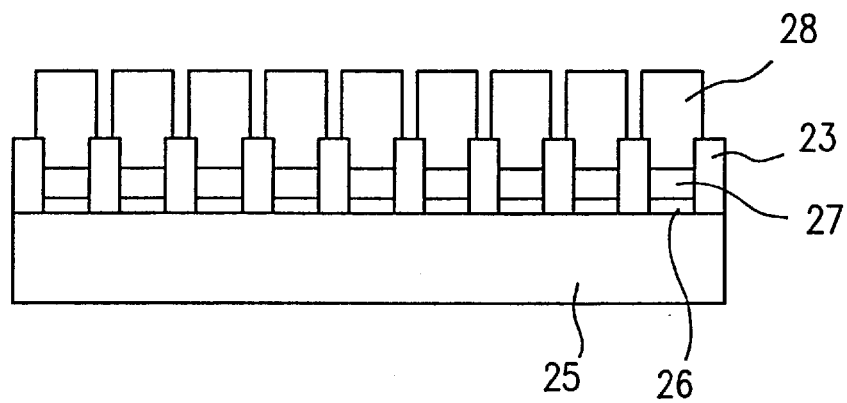
FIG. 5 is a cross-sectional view showing an initial growth stage of a compound semiconductor substrate in which GaN crystal is grown on a mica substrate including an $SiO_2$ layer as a mask pattern layer in Embodiment 5 of the present invention.
Figure 6:
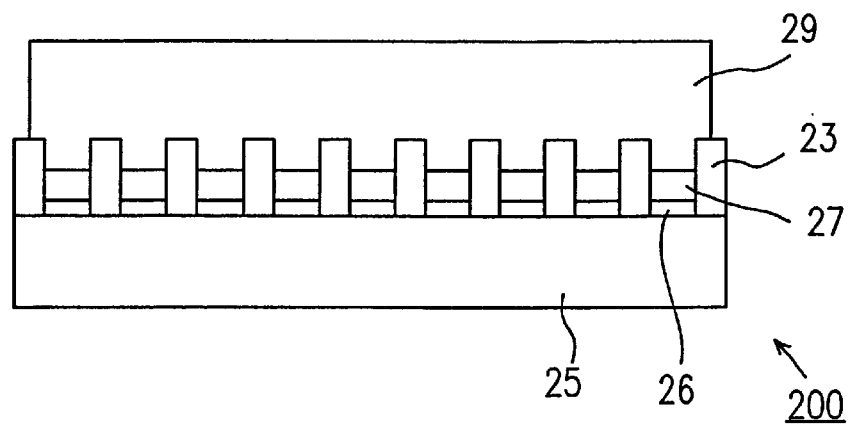
FIG. 6 is a cross-sectional view of a compound semiconductor substrate in which GaN crystal is grown on a mica substrate including an $SiO_2$ layer as a mask pattern layer after the formation of a large crystal layer in Embodiment 5 of the present invention.

In the present embodiment, an $SiO_2$ layer (mask pattern layer) is patterned on a mica substrate, strain stress is dispersed and relaxed in this portion, and GaN crystal with satisfactory crystallinity is grown. The present embodiment will be described with reference to FIGS. 4 to 6. FIG. 4 is a top view of a mica substrate including an $SiO_2$ layer as a mask pattern layer, produced in Embodiment 5 of the present invention. FIG. 5 is a cross-sectional view showing an initial growth stage of a compound semiconductor substrate in which GaN crystal is grown on a mica substrate including an $SiO_2$ layer as a mask pattern layer in Embodiment 5 of the present invention. FIG. 6 is a cross-sectional view of a compound semiconductor substrate in which GaN crystal is grown on a mica substrate including an $SiO_2$ layer as a mask pattern layer after the formation of a large crystal layer in Embodiment 5 of the present invention. In the same way as in Embodiments 1 to 3, a mica substrate made of synthetic mica ($KMg_3(Si_3AlO_{10})F_2$) is used as a substrate for growth, and the surface of the substrate is prescribed as a C-plane of the mica substrate.

The surface of a mica substrate 25 was washed with an organic solvent. An $SiO_2$ layer 23 was deposited on the mica substrate 25 to a thickness of about 1.0 μm by sputtering. Then, as shown in FIG. 4, the $SiO_2$ layer was patterned so as to define openings 24 (square with each side of about 50 μm) positioned at an interval with a pattern width of about 3 μm by using photolithography.

Then, the mica substrate 25 was placed in an MOCVD apparatus. The mica substrate 25 was cleaned by being heated to about 1100° C. in a flow of $H_2$. Thereafter, the mica substrate 25 was cooled to about 550° C. TMG (about 50 μmol/min.) and $NH_3$ (about 4.0 liter/min.) were supplied to the apparatus, whereby a GaN intermediate layer 26 (about 100 nm) was grown in the openings 24. Then, TMG (about 50 μmol/min.) and $NH_3$ (about 4.0 liter/min.) were supplied to the apparatus at about 1050° C., whereby a GaN crystal layer 27 (about 0.5 μm) was grown on the GaN intermediate layer 26.

Thereafter, in the same way as in Embodiment 3, a GaN layer 29 was grown on the mica substrate 25 by an HVPE method. At an initial stage of growth, islands 28 of GaN crystal were formed in the shape of a column. When the growth was continued, the islands 28 also grew in a lateral direction until they came into contact with each other to obtain a large GaN crystal layer 29. Thus, a compound semiconductor substrate 200 was produced.

The thickness of the GaN layer 29 grown for about 3 hours was about 300 µm. No conspicuous defects were observed at positions corresponding to the connected portions of the islands 28. The GaN layer 29 exhibited about 3 arcmin. of half-width of a diffraction peak obtained with respect to crystal (0004) irradiated with X-rays. The growth film was transparent, and defects of about $10^6$ cm$^{-2}$ were generated on the surface of the GaN layer 29. Defect density was reduced more than the previous embodiments. The reasons for this can be considered as follows.

Defects were formed in the vicinity of the $SiO_2$ layer, thereby relaxing strain stress generated from the lattice mismatching and the difference in thermal expansion coefficient between the mica substrate 25 and the GaN layer 29. The mask pattern layer was provided over the entire surface of the substrate, whereby cracks in a layer direction of the mica substrate introduced by strain stress were uniformly generated over the entire surface, and strain was uniformly relaxed with respect to the substrate. The mask pattern layer prevented the dislocations from proceeding from the underlying layer.

In the present embodiment, it is desirable that the pattern width is about 0.5 µm to about 8 µm, and one side of each opening is in a range of about 20 µm to about 2000 µm. When the pattern width is smaller than about 0.5 µm, the islands of GaN crystal are connected to each other in the openings before the islands start growing with satisfactory crystallinity, which is not preferable. In contrast, when the pattern width is larger than about 8 µm, the islands of GaN crystal grown in the openings cannot be connected to each other, and a ratio per unit area of the connected portions between the mask pattern layer and the GaN crystal layer decreases, making it undesirably difficult to relax strain stress in the connected portions. When one side of each opening is smaller than about 20 µm, a growth speed becomes greater in the direction vertical to the substrate than in the direction horizontal thereto, and the islands of GaN crystal cannot be connected to each other by the growth in the horizontal direction, which is not preferable. In contrast, when one side of each opening is larger than about 2000 µm, a ratio per unit area of the connected portions between the mask pattern layer and the GaN crystal layer decreases for the same reason as that described above, making it undesirably difficult to relax strain stress. In the present embodiment, the case where the shape of each opening of the mask pattern layer is a square is described. However, the shape of each opening is not limited to a square, and any suitable shape may be used.

The material for the mask pattern layer is preferably selected from the group consisting of $SiO_2$, $Si_3N_4$, and TiN.

In the present embodiment, when $In_yGa_{1-y}N$ (0<y<1) was used for the growth film, in place of GaN, the same effects as those described above were obtained. Furthermore, even when a crystal layer of AlN, $Al_xGa_{1-x}N$(0<x<1) or $In_yGa_{1-y}N$(0<y<1) was grown by using a growth method such as an MOCVD method, an MBE method, or an MOMBE method, in place of the HVPE method, the same effects as those described above were obtained. Furthermore, it was confirmed that even when a III-V group compound semiconductor having a multi-layer structure is grown by varying the composition of a crystal growth layer, and the kind, concentration, etc. of a dopant, the same effects as those in the present embodiment are obtained.

Furthermore, in the same way as in Embodiments 1to 4, the compound semiconductor substrate including a III-V group compound semiconductor layer such as a GaN crystal layer produced as described above can be used as a substrate on which a III-V group compound semiconductor crystal containing nitrogen as its main component is grown. In the case where the compound semiconductor substrate containing a III-V group compound semiconductor crystal layer of the present embodiment is used as a substrate on which a III-V group compound semiconductor containing nitrogen as its main component is grown, higher quality crystal growth layer can be obtained, compared with Embodiments 1to 4.

Embodiment 6

Figure 7:
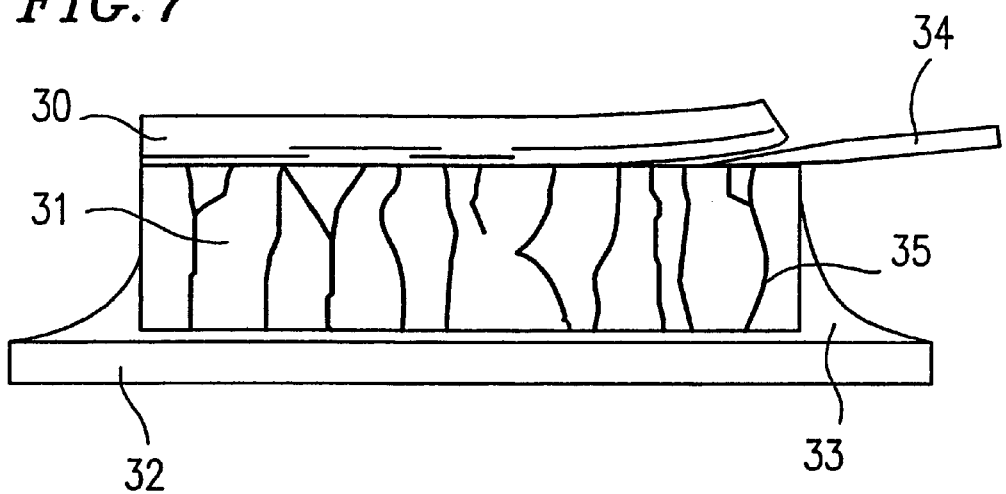
FIG. 7 is a schematic view illustrating the step of peeling a mica substrate from a GaN crystal layer in Embodiment 6 of the present invention.

In the present embodiment, the case where a mica substrate is peeled from a compound semiconductor substrate containing a nitride semiconductor grown on the mica substrate will be described with reference to FIG. 7.

As described above, a mica substrate has a layered structure, so that it can be easily peeled from a growth film, and the growth film becomes a compound semiconductor substrate. Particularly, in the case where materials with different compositions are grown on the mica substrate, strain stress is caused by the difference in thermal expansion coefficient between the respective materials due to the changes in temperature. Therefore, the mica substrate becomes likely to be peeled from the compound semiconductor substrate. Furthermore, in the case where a III-V group compound semiconductor layer containing nitrogen as its main component is grown on the mica substrate, the hardness of the growth layer is larger than that of the mica substrate, so that only the mica substrate can be peeled from the compound semiconductor substrate without damaging the growth film. For example, the mica substrate was able to be peeled from the compound semiconductor substrate by the following method.

It will be described that a mica substrate produced in the same way as in Embodiment 1is peeled from a compound semiconductor substrate including a GaN crystal layer grown on the mica substrate. As shown in FIG. 7, first, wax 33 was coated onto the entire surface of a GaN crystal layer (growth film) 31, and the GaN crystal layer 31 was bonded to a flat plate 32. Thereafter, the mica substrate 30 and the growth film 31 were separated from each other with a sharp blade 34 such as a knife, whereby the mica substrate 30 was removed.

The above-mentioned method allowed the mica substrate to be substantially removed. Furthermore, it was possible to completely remove the mica substrate by polishing the exposed surface.

The mica-free growth film thus produced can be used as a substrate on which a III-V group compound semiconductor layer containing nitrogen as its main component is grown. Actually, in the compound semiconductor substrates produced in Embodiments 1to 5, when only the crystal layer obtained by peeling the mica substrate from the compound semiconductor substrate is used as a substrate for growth, strain stress from the mica substrate is unlikely to affect a III-V group compound semiconductor layer containing nitrogen as its main component and a crystal layer grown thereon. Therefore, high quality growth crystal can be obtained.

In the present embodiment, even when a crystal layer of AlN, $Al_xGa_{1-x}N$(0<x<1), or $In_yGa_{1-y}N$(0<y<1) was grown, the same effects as those described above were obtained. Furthermore, it was confirmed that even when a III-V group compound semiconductor having a multilayer structure is grown by varying the composition of a crystal growth layer, and the kind, concentration, etc. of a dopant, the mica substrate can be easily peeled off in the same way as in the present embodiment.

It is preferable that a III-V group compound semiconductor layer containing nitrogen as its main component is grown on a mica substrate, and then, the mica substrate is removed by peeling. While the III-V group compound semiconductor layer containing nitrogen as its main component is grown, a mica substrate may be partially peeled off. In this case, if required, the mica substrate is peeled from the growth layer with a peeling knife, and then, the exposed surface is polished, whereby a compound semiconductor substrate with the mica substrate removed therefrom, including a III-V group compound semiconductor layer containing nitrogen as its main component, can be obtained. Alternatively, by polishing the mica substrate without using a peeling knife, a compound semiconductor substrate with the mica substrate removed therefrom, including a III-V group compound semiconductor layer containing nitrogen as its main component, can be obtained.

As described above, a III-V group compound semiconductor layer containing nitrogen as its main component is grown on a mica substrate to a thickness of at least 40 µm, and then, the mica substrate is peeled off. Thus, the III-V group compound semiconductor layer can be protected from stress of the mica substrate, and a good quality III-V group compound semiconductor layer containing nitrogen as its main component can be provided. Furthermore, a substrate for homo-junction of a III-V group compound semiconductor layer containing nitrogen as its main component can be produced from this compound semiconductor crystal.

Embodiment 7

In the present embodiment, the case where a mica substrate is made of crystal having a composition of $\alpha_{1-x}\beta_{3-y}(\gamma_4 O_{10})\delta_2$. Herein:

$0 \leq x \leq 0.5$;

$0 \leq y \leq 1$;

α is selected from the group consisting of K, Ca, Na, Ba, NH$_4$, and H$_3$O;

β is selected from the group consisting of Al, Fe, Mg, Mn, Li, Zn, V, Cr, and Ti;

γ is one or more element selected from the group consisting of Si, Al, Be, and Fe; and δ is F or OH.

In the same way as in Embodiments 1 and 2, a GaN layer was grown on a mica substrate directly or via an intermediate layer.

In the case of a compound semiconductor substrate with the GaN layer directly grown thereon, the GaN growth layer was transparent, and exhibited about 16 arcmin. of half-width of a diffraction peak obtained with respect to crystal (0004) irradiated with X-rays. There were dislocations (about $10^9$ cm$^{-2}$) generated on the surface of the GaN growth layer. In the case of a compound semiconductor substrate with the GaN layer grown via a ZnO intermediate layer, there were defects (about $10^8$ cm$^{-2}$) generated on the surface of the GaN growth layer, and the GaN growth layer exhibited about 7 arcmin. of half-width of a diffraction peak obtained with respect to crystal (0004) irradiated with X-rays. In either case, cracks were generated in a layer direction on the mica substrate, which relaxed strain stress caused by the difference in lattice mismatching and thermal expansion coefficient between the mica substrate and the GaN growth layer.

With the above-mentioned mica material ($\alpha_{1-x}\beta_{3-y}(\gamma_4 O_{10})\delta_2$), the heat resistance (about 550° C. to about 1350° C.), the lattice constant ($a_0$=about 5.21 to about 5.31 Å, $b_0$=about 9.01 to about 9.21 Å, $c_0$=about 10.07 to about 10.22 Å), the thermal expansion coefficient (thermal expansion coefficient in an in-plane direction =about 8 to about 90×10$^{-6}$/° C., the thermal expansion coefficient in a c-axis direction=about 15 to about 280×10$^{-6}$/° C.), and the like can be changed by slightly varying the material. Thus, the characteristics of the mica substrate can be changed, depending upon the composition and layer structure of a nitride semiconductor grown on the mica substrate. Accordingly, satisfactory crystal can be obtained during growth of all the III-V group compound semiconductors containing nitrogen, depending upon a crystal layer of AlN, Al$_x$Ga$_{1-x}$N(0<x<1), In$_y$Ga$_{1-y}$N(0<y<1), in addition to GaN.

Furthermore, it was confirmed that in the case where a crystal layer is grown via a mask pattern layer by using the above-mentioned mica in the same way as in Embodiments 5 and 6, and in the case where the mica substrate is peeled from the compound semiconductor substrate, the crystallinity of the III-V group compound semiconductor layer containing nitrogen as its main component can be enhanced.

In the present embodiment, when In$_y$Ga$_{1-y}$N(0<y<1) was used for the growth film, in place of GaN, the same effects as those described above were obtained. Furthermore, even when a crystal layer of AlN, Al$_x$Ga$_{1-x}$N(0<x<1), In$_y$Ga$_{1-y}$N (0<y<1), or In$_\alpha$Ga$_\beta$Al$_{1-\alpha-\beta}$N(0<α<1, 0<β<1) was grown by using a growth method such as an MOCVD method, an MBE method, or an MOMBE method, in place of the HVPE method, the same effects as those described above were obtained. Furthermore, it was confirmed that even when a III-V group compound semiconductor having a multi-layer structure is grown by varying the composition of a crystal growth layer, and the kind, concentration, etc. of a dopant, the same effects as those in the present embodiment are obtained.

Furthermore, in the same way as in the abovementioned embodiments, the compound semiconductor substrate including a III-V group compound semiconductor layer such as a GaN crystal layer can be used as a substrate on which a III-V group compound semiconductor crystal containing nitrogen as its main component is grown, whereby high quality crystal growth layer can be obtained.

Embodiment 8

Figure 8:
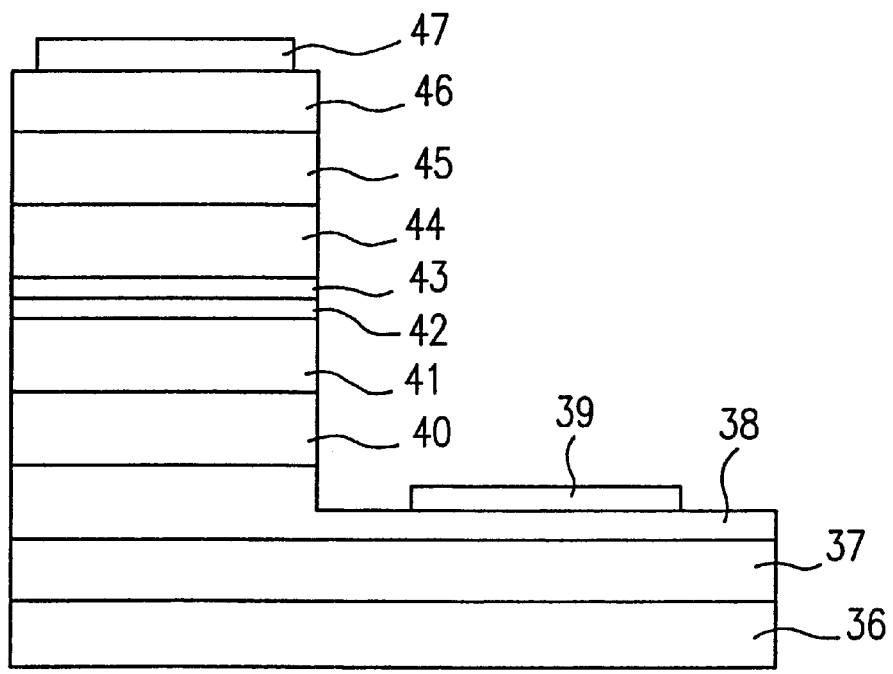
FIG. 8 is a cross-sectional view of a laser device, produced in Embodiment 8 of the present invention.

In the present embodiment, the case where a laser chip (which is one of devices using, as a substrate, GaN crystal grown on a mica substrate) is produced will be described with reference to FIG. 8. FIG. 8 is a cross-sectional view of a laser device produced in the present embodiment.

First, a compound semiconductor substrate including a mica substrate 36 and a GaN layer 37 grown thereon, produced in the same way as in Embodiment 3 was washed with an organic solvent. Then, the compound semiconductor substrate was placed in an MOCVD apparatus, and cleaned by being heated to about 1100° C. in a flow of H$_2$. Next, TMG (about 50 µmol/min.), NH$_3$ (about 4.0 liter/min.), and SiH$_4$ (about 1nmol/min.) were supplied to the apparatus at about 1050° C., whereby an n-type GaN layer 38 was grown to a thickness of about 4 µm on the compound semiconductor substrate. In addition, trimethylaluminum (TMA) (about 60 µmol/min.) was supplied to grow an n-type Al$_{0.15}$Ga$_{0.85}$N layer 40 to a thickness of about 0.5 µm on the n-type GaN layer 38. Thereafter, the supply of TMA was stopped, and an n-type GaN layer 41 was grown to a thickness of about 0.1 µm on the n-type Al$_{0.15}$Ga$_{0.85}$N layer 40.

Next, the compound semiconductor substrate was cooled to about 770° C. SiH$_4$ (about 0.1 nmol/min.), trimethylindium (TMI)(about 300 µmol/min.), TMG (about 50 µmol/min.), and NH$_3$ (about 8.0 liter/min.) were supplied for about 20 seconds, and TMI (about 40 μmol/min.) was supplied for about 20 seconds. This cycle was repeated 5 times, whereby an $In_{0.15}Ga_{0.85}N$—$In_{0.03}Ga_{0.97}N$ active layer 42 having a multi quantum well (MQW) structure was grown.

The supply of TMG and TMI was stopped, and the substrate was heated to about 1050° C. Then, TMG (about 50 μmol/min.), $NH_3$ (about 4.0 liter/min.), TMA (about 90 μmol/min.), and bis(cyclopentadienyl)magnesium ($CP_2Mg$) (about 0.4 μmol/min.) were supplied, whereby an $Al_{0.2}Ga_{0.8}N$ evaporation stop layer 43 was grown. Thereafter, the supply of TMA was stopped, and a p-type GaN layer 44 was grown to a thickness of about 0.1 μm. Then, $CP_2Mg$ (about 0.7 μmol/min.) and TMA (about 60 μmol/min.) were supplied, whereby a p-type $Al_{0.15}Ga_{0.85}N$ layer 45 was grown to a thickness of about 0.5 μm. The supply of TMA was stopped, and $CP_2Mg$ (about 0.6 μmol/min.) was supplied, whereby a p-type GaN layer 46 were grown to a thickness of about 0.4 μm. Thereafter, the supply of $CP_2Mg$ and TMG was stopped, and the substrate was cooled to about 350° C. in an atmosphere of $NH_3$. Thereafter, the substrate was cooled to room temperature in an atmosphere of $H_2$.

Next, a groove was formed in the resultant substrate from the growth surface of the p-type GaN layer 46 to the n-type GaN layer 38 by photolithography and dry etching. Then, an n-type electrode 39 made of Ti and Al was formed on the exposed n-type GaN layer 38, and a p-type stripe electrode 47 (width of about 20 μm×length of about 1200 μm) made of Ni and Au was formed on the surface of the p-type GaN layer 46. Furthermore, the resultant substrate was divided into chips by dicing, cleavage, or the like. Thus, an LD device 300 as shown in FIG. 8 was produced.

The LD device 300 laser-oscillated at room temperature. A threshold current and a threshold voltage were about 160 mA and about 5.8 volts, respectively. On the other hand, for comparison, an LD device with the same structure as that of the LD device 300 produced in the same way, using a sapphire (C-plane) substrate in place of a mica substrate, did not laser-oscillate at room temperature. The reasons for this are considered to be follows: when a GaN crystal layer on a mica substrate is used as a substrate for producing an LD device, the crystal to be grown on the substrate will have more satisfactory crystallinity and have less defects, so that factors of decreasing light-emitting characteristics such as a leak current and Mg diffusion are suppressed.

In the case where a compound semiconductor substrate produced in the same way as in Embodiments 2 and 3 was used as a substrate for producing an LD device, light-emitting characteristics were also improved. Furthermore, in the case where a compound semiconductor substrate including an $In_{0.15}Ga_{0.85}N$ crystal layer produced in Embodiment 4 was used as a substrate for producing an LD device, a threshold current and a threshold voltage decreased, whereby light-emitting characteristics were improved. Furthermore, in the case of using a GaN crystal substrate produced in the same way as in Embodiment 5 as a substrate for producing an LD device, a threshold current and a threshold voltage further decreased, whereby light-emitting characteristics were further improved.

Furthermore, in the case where an LD device is produced in the same way as in Embodiment 8, using the GaN substrate produced in the same way as in Embodiment 6 as a substrate for producing an LD device, cleavage becomes easy and a laser facet can be satisfactorily formed. Thus, a light-emitting efficiency was further improved. In this case, an n-type electrode can be first formed on a substrate, so that the step of dry-etching is omitted, and yield can be improved.

As described above, according to the present invention, a compound semiconductor substrate is provided, in which dislocations in crystal in a III-V group compound semiconductor layer containing nitrogen as its main component are reduced and which includes a high quality nitride compound semiconductor layer with a narrow X-ray half-width value on a mica substrate.

By peeling the mica substrate from the compound semiconductor substrate, a III-V group compound semiconductor substrate containing nitrogen as its main component can be produced, in which the influence of strain from the underlying mica substrate is suppressed.

Furthermore, by using the above-mentioned compound semiconductor substrate for producing a light-emitting element, a high quality device with high reliability can be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a compound semiconductor substrate, comprising the steps of growing a III-V group compound semiconductor layer containing nitrogen on a mica substrate, and providing an intermediate layer between the mica substrate and the III-V group compound semiconductor layer, the intermediate layer being $Al_xGa_{1-x}N$ ($0 \leq x \leq 1$), wherein the intermediate layer is grown on the mica substrate at a second temperature lower than a first temperature of growing a compound semiconductor layer.

2. The method for producing a compound semiconductor substrate according claim 1, further comprising the step of providing a mask pattern layer on a surface of a side of the mica substrate on which the III-V group compound semiconductor layer is grown.

3. The method for producing a compound semiconductor substrate according to claim 1, further comprising the step of peeling the mica substrate from the III-V group compound semiconductor layer.

4. The method for producing a compound semiconductor substrate according to claim 1, wherein the mica substrate is made of crystal having a composition of $\alpha_{1-x}\beta_{3-y}(\gamma_4O_{10})\delta_2$, wherein 0 $\leq x \leq$ 0.5;

0 $\leq y \leq$ 1;

α is selected from the group consisting of K, Ca, Na, Ba, $NH_4$, and $H_3O$;

β is selected from the group consisting of Al, Fe, Mg, Mn, Li, Zn, V, Cr, and Ti;

γ is one or more elements selected from the group consisting of Si, Al, Be, and Fe; and δ is F or OH.

5. The method for producing a compound semiconductor substrate according to claim 4, wherein the mica substrate is made of crystal having a composition of $Mg_3(Si_3AlO_{10})(OH)_2$.

6. The method for producing a compound semiconductor substrate according to claim 1, wherein the step of growing the III-V group compound semiconductor layer on the mica substrate includes the steps of: forming a mask pattern layer on the mica substrate; forming the intermediate layer in a region of the mica substrate where the mask pattern layer is not formed; growing a first III-V group compound semiconductor layer containing nitrogen on the intermediate layer by a first growth method; and growing a second III-V group compound semiconductor layer as the composition of the first III-V group compound semiconductor layer on the first III-V group compound semiconductor layer by a second growth method, and the method further includes the step of peeling the mica substrate from the first and second III-V group compound semiconductor layers.

7. The method for producing a compound semiconductor substrate according to claim 1, wherein the intermediate layer has the same composition as the III-V group compound semiconductor layer.

8. The method for producing a compound semiconductor substrate according to claim 7, wherein the mica substrate is made of crystal having a composition of $\alpha_{1-x}\beta_{3-y}(\gamma_4O_{10})\delta_2$, wherein $0 \leq x \leq 0.5$;

$0 \leq y \leq 1$;

$\alpha$ is selected from the group consisting of K, Ca, Na, Ba, $NH_4$, and $H_3O$;

$\beta$ is selected from the group consisting of Al, Fe, Mg, Mn, Li, Zn, V, Cr, and Ti;

$\gamma$ is one or more elements selected from the group consisting of Si, Al, Be, and Fe; and $\delta$ is F.

9. A method for producing a compound semiconductor substrate, comprising the steps of growing a III-V group compound semiconductor layer containing nitrogen on a mica substrate, and providing an intermediate layer between the mica substrate and the III-V group compound semiconductor layer, the intermediate layer being $Al_xGa_{1-x}N$ ($0 \leq x \leq 1$), wherein the mica substrate is made of crystal having a composition of $KMg_3(Si_3AlO_{10})F_2$.

10. A method for producing a light-emitting element comprising the step of providing a semiconductor layered structure including at least a light-emitting layer on a III-V group compound semiconductor layer, wherein the III-V group compound semiconductor layer is produced during the step of growing the III-V group compound semiconductor layer of claim 1.

11. A method for producing a compound semiconductor substrate, comprising the steps of growing a III-V group compound semiconductor layer containing nitrogen on a mica substrate, and providing a mask pattern layer on a surface of a side of the mica substrate on which the III-V group compound semiconductor layer is grown and a mask pattern layer is made of material different from that of the mica substrate, wherein the mica substrate is made of crystal having a composition of $\alpha_{1-x}\beta_{3-y}(\gamma_4O_{10})\delta_2$, wherein $0 \leq x \leq 0.5$;

$0 \leq y \leq 1$;

$\alpha$ is selected from the group consisting of K, Ca, Na, Ba, $NH_4$, and $H_3O$;

$\beta$ is selected from the group consisting of Al, Fe, Mg, Mn, Li, Zn, V, Cr, and Ti;

$\gamma$ is one or more elements selected from the group consisting of Si, Al, Be, and Fe; and $\delta$ is F.

12. The method for producing a compound semiconductor substrate according to claim 11, further comprising the step of peeling the mica substrate from the III-V group compound semiconductor layer.

13. The method for producing a compound semiconductor substrate according to claim 11, wherein the mica substrate is made of crystal having a composition of $KMg_3(Si_3AlO_{10})F_2$.

14. The method for producing a compound semiconductor substrate according to claim 11, wherein the step of growing the III-V group compound semiconductor layer on the mica substrate includes the steps of: forming the mask pattern on the mica substrate; forming an intermediate layer in a a substrate where the mask pattern layer is not formed; growing a first III-V group compound semiconductor layer containing nitrogen on the intermediate layer by a first growth method; and growing a second III-V group compound semiconductor layer as the composition of the first III-V group compound semiconductor layer on the first III-V group compound semiconductor layer by a second growth method, and the method further includes the step of peeling the mica substrate from the first and second III-V group compound semiconductor layers.

15. The method for producing a light-emitting element comprising the step of providing a semiconductor layered structure including at least a light-emitting layer on a III-V group compound semiconductor layer, wherein the III-V group compound semiconductor layer is produced during the step of growing the III-V group compound semiconductor layer of claim 11.

16. The method for producing a compound semiconductor substrate according to claim 11, wherein the intermediate layer is grown on the mica substrate at a second temperature lower than a first temperature of growing a compound semiconductor layer.

17. The method for producing a compound semiconductor substrate according to claim 16, wherein the intermediate layer has the same composition as the III-V group compound semiconductor layer.

18. The method for producing a compound semiconductor substrate according to claim 11, wherein the step of growing the III-V group compound semiconductor layer is continuously conducted so as to obtain growth in the lateral direction connecting regions of vertical growth so as to provide a single unit as a whole, thereby obtaining a crystal of large dimensions.

19. A method for producing a compound semiconductor substrate, comprising the step of growing a III-V group compound semiconductor layer containing nitrogen on a mica substrate, wherein the mica substrate is made of crystal having a composition of $\alpha_{1-x}\beta_{3-y}(\gamma_4O_{10})\delta_2$, wherein $0 \leq x \leq 0.5$;

$0 \leq y \leq 1$;

$\alpha$ is selected from the group consisting of K, Ca, Na, Ba, $NH_4$, and $H_3O$;

$\beta$ is selected from the group consisting of Al, Fe, Mg, Mn, Li, Zn, V, Cr, and Ti;

$\gamma$ is one or more elements selected from the group consisting of Si, Al, Be, and Fe; and $\delta$ is F.

20. The method for producing a compound semiconductor substrate according to claim 19, wherein the mica substrate is made of crystal having a composition of $KMg_3(Si_3AlO_{10})F_2$.

21. The method for producing a compound semiconductor substrate according to claim 19, wherein the step of growing the III-V group compound semiconductor layer on the mica substrate includes the steps of: forming a mask pattern layer on the mica substrate; forming an intermediate layer in a region of the mica substrate where the mask pattern layer is not formed; growing a first III-V group compound semiconductor layer containing nitrogen on the intermediate layer by a first growth method; and growing a second III-V group compound semiconductor layer as the composition of the first III-V group compound semiconductor layer on the first III-V group compound semiconductor layer by a second growth method, and the method further includes the step of peeling the mica substrate from the first and second III-V group compound semiconductor layers.

22. The method for producing a light-emitting element comprising the step of providing a semiconductor layered structure including at least a light-emitting layer on a III-V group compound semiconductor layer, wherein the III-V group compound semiconductor layer is produced during the step of growing the III-V group compound semiconductor layer of claim 19.

23. A method for producing a compound semiconductor substrate, comprising the step of growing a III-V group compound semiconductor layer containing nitrogen directly on a mica substrate, wherein the mica substrate is made of crystal having a composition of $\alpha_{1-x}\beta_{3-y}(\gamma_4 O_{10})\delta_2$, wherein $0 \leq x \leq 0.5$;

$0 \leq y \leq 1$;

α is selected from the group consisting of K, Ca, Na, Ba, $NH_4$, and $H_3O$;

β is selected from the group consisting of Al, Fe, Mg, Mn, Li, Zn, V, Cr, and Ti;

γ is one or more elements selected from the group consisting of Si, Al, Be, and Fe; and δ is F.

24. The method for producing a compound semiconductor substrate according to claim 23, further comprising the step of peeling the mica substrate from the III-V group compound semiconductor layer.

25. The method for producing a light-emitting element comprising the step of providing a semiconductor layered structure including at least a light-emitting layer on a III-V group compound semiconductor layer, wherein the III-V group compound semiconductor layer is produced during the step of growing the III-V group compound semiconductor layer of claim 23.

26. The method for producing a compound semiconductor substrate according to claim 23, wherein the mica substrate is a synthetic mica substrate.

27. The method for producing a compound semiconductor substrate according to claim 26, wherein the synthetic mica substrate is made of crystal having a composition of $Mg_3(Si_3AlO_{10})(OH)_2$.

* * * * *